(12) United States Patent
Brecht et al.

(10) Patent No.: US 11,272,616 B2
(45) Date of Patent: Mar. 8, 2022

(54) CONNECTING CIRCUIT BOARDS

(71) Applicant: Teradyne, Inc., North Reading, MA (US)

(72) Inventors: Brian Brecht, Newbury Park, CA (US); Roger A. Plante, North Attleboro, MA (US); Richard Pye, Burlington, MA (US); Julie Robison, Camarillo, CA (US); Alfred M. Zakarian, Winchester, MA (US); William Patti, Chelsea, MA (US); Mark Garcia, Sylmar, CA (US); Shih-Fan Chen, San Jose, CA (US); Kenneth L. Degan, Hopkinton, MA (US); Heng-Kit Too, Oak Park, CA (US)

(73) Assignee: TERADYNE, INC., North Reading, MA (US)

( * ) Notice: Subject to any disclaimer, the term of this patent is extended or adjusted under 35 U.S.C. 154(b) by 0 days.

(21) Appl. No.: 16/938,287

(22) Filed: Jul. 24, 2020

(65) Prior Publication Data

US 2022/0030718 A1 Jan. 27, 2022

(51) Int. Cl.
*H05K 1/14* (2006.01)
*H05K 1/11* (2006.01)
*H05K 1/16* (2006.01)

(52) U.S. Cl.
CPC ............ *H05K 1/144* (2013.01); *H05K 1/115* (2013.01); *H05K 1/119* (2013.01); *H05K 1/162* (2013.01); *H05K 2201/0367* (2013.01)

(58) Field of Classification Search
CPC ........ H05K 1/115; H05K 1/119; H05K 1/141; H05K 1/144; H05K 1/162;
(Continued)

(56) References Cited

U.S. PATENT DOCUMENTS

| 6,550,662 | B2 | 4/2003 | Too |
| 7,872,469 | B2* | 1/2011 | Lui ..................... G01R 31/2889 324/750.3 |
| 2002/0139832 | A1 | 10/2002 | Too et al. |
| 2003/0003705 | A1* | 1/2003 | Chung .............. H01L 23/49822 438/612 |

(Continued)

OTHER PUBLICATIONS

Boesing, Danny, "Guidelines for Paste-In-Hole Reflow Processing", The Samtec Blog. May 24, 2016, 9 pages, retrieved from: https://blog.samtec.com/post/guidelines-paste-hole-reflow-processing/.

(Continued)

*Primary Examiner* — Roshn K Varghese
(74) *Attorney, Agent, or Firm* — Burns & Levinson LLP

(57) ABSTRACT

An example apparatus includes a first printed circuit board (PCB) having a power layer, a ground layer, and a slot. The slot includes a first power electrical contact that is electrically connected to the power layer and a first ground electrical contact that is connected to the ground layer. The slot extends orthogonally or obliquely through multiple layers of the first PCB. A second PCB includes a second power electrical contact, a second ground electrical contact, and capacitors electrically connected between the second power electrical contact and the second ground electrical contact. The second PCB is configured for insertion into the slot to form an electrical connection between the first power electrical contact and the second power electrical contact and between the first ground electrical contact and the second ground electrical contact.

25 Claims, 13 Drawing Sheets

(58) Field of Classification Search
CPC ..... H05K 2201/0367; H05K 2201/044; H05K 2201/048; H05K 2201/049; H05K 2201/09081; H05K 3/366; G01R 31/2834; G01R 31/2879
See application file for complete search history.

(56) References Cited

U.S. PATENT DOCUMENTS

| | | |
|---|---|---|
| 2007/0019081 A1 | 1/2007 | Nakashima |
| 2008/0084675 A1 | 4/2008 | Amirali et al. |
| 2010/0197150 A1* | 8/2010 | Smejtek .............. H05K 3/366 439/61 |
| 2014/0133115 A1* | 5/2014 | Iguchi .............. H05K 1/0243 361/760 |
| 2017/0146632 A1 | 5/2017 | Wadell et al. |
| 2019/0037689 A1* | 1/2019 | Du .................. H05K 1/0284 |

OTHER PUBLICATIONS

Hinerman, Jay B. et al., "The Pin-in-Paste (or AART) Process for Odd Form and Through Hole Printed Circuit Boards". Universal Instruments Corporation, Sep. 27, 2007, Binghamton, NY. 6 pages, pp. 1-6.

Martel, Michael L., "Paste in Hole (PIH) Printing with an Enclosed Media Solution", Speedline Technologies, Inc. In: Global SMT & Packaging, vol. 13, No. 12, London, UK, 6 pages (Dec. 2013).

"The Application of the Pin-in-Paste Reflow Process", 2020, 3 pages, retrieved from https://www.7pcb.com/blog/the-application-of-the-pin-in-paste-reflow-process.php.

* cited by examiner

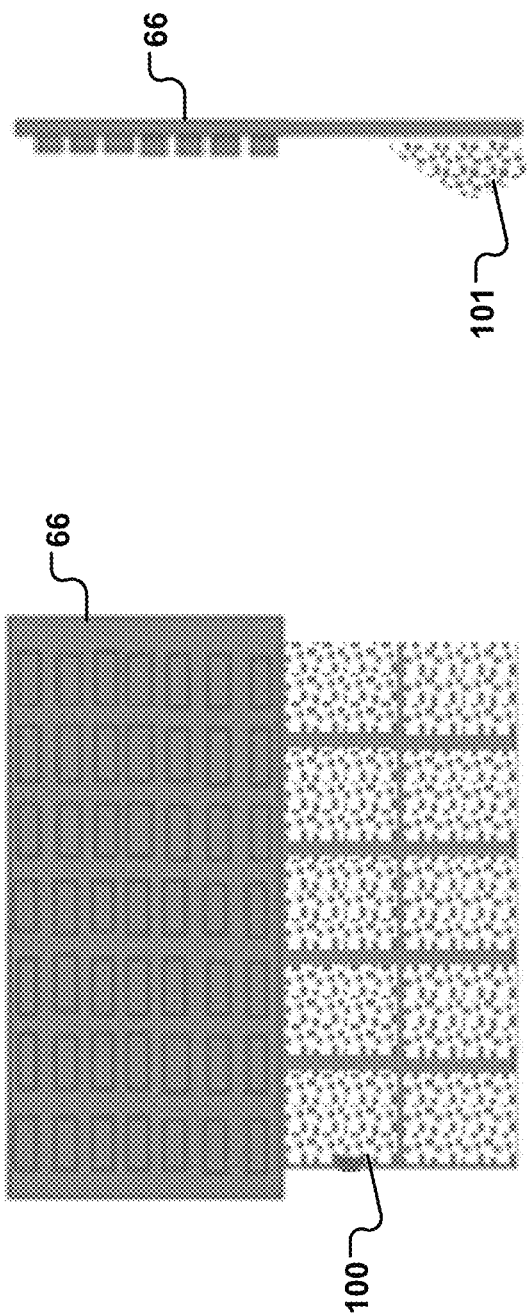

CONNECTING CIRCUIT BOARDS

TECHNICAL FIELD

This specification describes examples of techniques for implementing electrical connections between two or more printed circuit boards.

BACKGROUND

FIG. 1 shows an example of a connection between two printed circuit boards (PCBs). The first PCB 10 and the second PCB 11 are arranged in parallel. Solder balls 12 connect electrical contacts on first PCB 10 to electrical contacts on second PCB 11. The electrical contacts on second PCB 11 connect electrically to vias 14 in PCB 11, which lead to conductive layers 15 in PCB 11.

SUMMARY

An example apparatus includes a first printed circuit board (PCB) that includes a power layer, a ground layer, and a slot. The slot includes a first power electrical contact that is electrically connected to the power layer and a first ground electrical contact that is connected to the ground layer. The slot extends orthogonally or obliquely through multiple layers of the first PCB. A second PCB includes a second power electrical contact, a second ground electrical contact, and capacitors electrically connected between the second power electrical contact and the second ground electrical contact. The second PCB is configured for insertion into the slot to form an electrical connection between the first power electrical contact and the second power electrical contact and between the first ground electrical contact and the second ground electrical contact. The apparatus may include one or more of the following features, either alone or in combination.

The capacitors may be configured to increase capacitance between the power layer and the ground layer without providing a proportional increase in inductance.

In an example, the power layer is a first power layer and the first PCB includes a second power layer and a fourth power electrical contact that is electrically connected to the second power layer. The ground layer is a first ground layer and the first PCB includes a second ground layer and a fourth ground electrical contact that is electrically connected to the second ground layer. The apparatus includes a third PCB that includes a third power electrical contact, a third ground electrical contact, and capacitors electrically connected between the third power electrical contact and the third ground electrical contact. The third PCB is configured for insertion into the slot along with the second PCB to form an electrical connection between the third power electrical contact and the fourth power electrical contact and between the third ground electrical contact and the fourth ground electrical contact.

The first PCB may include multiple power layers, multiple ground layers, multiple power electrical contacts each electrically connected to a power layer, and multiple ground electrical contacts each electrically connected to a ground layer. The second PCB may include multiple power electrical contacts each for making an electrical connection to one of the power electrical contacts on the first PCB when the second PCB is in the slot in the first PCB. The second PCB may include multiple ground electrical contacts each for making an electrical connection to one of the ground electrical contacts on the first PCB when the second PCB is in the slot in the first PCB. The third PCB may include multiple power electrical contacts each for making an electrical connection to one of the power electrical contacts on the first PCB when the third PCB is in the slot in the second PCB. The third PCB may include multiple ground electrical contacts each for making an electrical connection to one of the ground electrical contacts on the first PCB when the third PCB is in the slot in the second PCB.

In the slot, the second power electrical contact and the third power electrical contact may face away from each other and towards, respectively, the first power electrical contact and the fourth power electrical contact. The example apparatus may include solder or conductive adhesive between the first power electrical contact and the second power electrical contact. The solder or conductive adhesive is for creating at least part of the electrical connection between the first power electrical contact and the second power electrical contact. The example apparatus may include solder or conductive adhesive between the third power electrical contact and the fourth power electrical contact. The solder or conductive adhesive is for creating at least part of the electrical connection between the third power electrical contact and the fourth power electrical contact. The example apparatus may include solder or conductive adhesive between the first ground electrical contact and the second ground electrical contact. The solder or conductive adhesive is for creating at least part of the electrical connection between the first ground electrical contact and the second ground electrical contact. The example apparatus may include solder or conductive adhesive between the third ground electrical contact and the fourth ground electrical contact. The solder or conductive adhesive is for creating at least part of the electrical connection between the third ground electrical contact and the fourth ground electrical contact.

The second PCB may have a first side containing the second power electrical contact and a second side devoid of electrical contacts, and the third PCB may have a third side containing the third power electrical contact and a fourth side devoid of electrical contacts. In the slot, the second side of the second PCB and the fourth side of the third PCB may face each other and are separated by at least one spacer. In the slot, the second side of the second PCB and the fourth side of the third PCB may face each other and may be separated by a wire that forces apart the second PCB and the third PCB.

The example apparatus may include stabilizing material located at one or more of the following locations: ends of the second PCB and the third PCB that are farthest from the first PCB, where the second PCB and the third PCB intersect the first PCB, or where ends of the second PCB and the third PCB terminate within the first PCB or terminate external to the first PCB.

The first PCB may be or include a device interface board (DIB) of a test system. The DIB may be for providing mechanical and electrical connections between multiple devices under test (DUTs) and test electronics included in the test system. The first PCB may include multiple slots including the slot. Each of the multiple slots may be configured to receive only one PCB of a same type as the second PCB. Each of the multiple slots may be configured to receive two PCBs of a same type as the second PCB. PCBs are addable or removable from the slots to change a capacitance associated with one or more power layers in the first PCB.

An example method includes inserting a second PCB into a slot in a first PCB. The slot extends orthogonally or obliquely through multiple layers of the first PCB. The second PCB includes a second electrical contact containing solder or conductive adhesive. The first PCB includes a first electrical contact in the slot that aligns to the second electrical contact at least in part when the second PCB is in the slot. The example method also includes forcing the second electrical contact containing solder or conductive adhesive against the first electrical contact, and inserting a third printed circuit board (PCB) into the slot in the first PCB. The third PCB includes a third electrical contact containing solder or conductive adhesive that faces away from the second PCB. The first PCB includes a fourth electrical contact in the slot that aligns to the third electrical contact at least in part when the third PCB is in the slot. The example method also includes simultaneously forcing the third electrical contact containing solder or conductive adhesive against the fourth electrical contact and away from the second PCB, and treating the solder or conductive adhesive to implement electrical connections between the first PCB and the second PCB and between the first PCB and the third PCB. The second PCB includes first capacitors that are electrically connected to the second electrical contact and the third PCB includes second capacitors that are electrically connected to the third electrical contact. The example method may include one or more of the following features, either alone or in combination.

The first, second, third, and fourth electrical contacts in the preceding paragraph may be or include power electrical contacts. The second PCB may include a second ground electrical contact containing solder or conductive adhesive. The first PCB may include a first ground electrical contact in the slot that aligns to the second ground electrical contact at least in part when the second PCB is in the slot in the first PCB. Forcing the second electrical contact also may include simultaneously forcing the second ground electrical contact containing solder or conductive adhesive against the first ground electrical contact. The third PCB may include a third ground electrical contact containing solder or conductive adhesive that faces away from the second PCB. The first PCB may include a fourth ground electrical contact in the slot that aligns to the third ground electrical contact at least in part when the third PCB is in the slot. Forcing the third electrical contact also may include simultaneously forcing the third ground electrical contact containing solder or conductive adhesive against the fourth ground electrical contact and away from the second PCB.

The first PCB may include multiple power layers, multiple ground layers, multiple electrical contacts each electrically connected to a power layer, and multiple ground electrical contacts each electrically connected to a ground layer. The second PCB may include multiple electrical contacts each making an electrical connection to one of the electrical contacts on the first PCB when the second PCB is in the slot. The second PCB may include multiple ground electrical contacts each making an electrical connection to one of the ground electrical contacts on the first PCB when the second PCB is in the slot. The third PCB may include multiple electrical contacts each making an electrical connection to one of the electrical contacts on the first PCB when the third PCB is in the slot in the second PCB. The third PCB may include multiple ground electrical contacts each making an electrical connection to one of the ground electrical contacts on the first PCB when the third PCB is in the slot in the second PCB.

The example method may include inserting a wire between the second PCB and the third PCB. The wire may force one or more third electrical contacts containing solder or conductive adhesive against one or more fourth electrical contacts and simultaneously away from the second PCB. When inserted into the first PCB, the second PCB and the third PCB may be orthogonal to the first PCB.

Prior to treating, the second PCB includes solder or conductive adhesive directly above the second electrical contact. Prior to treating, the third PCB includes solder or conductive adhesive directly above the third electrical contact. Treating causes the solder or conductive adhesive directly above the second electrical contact to migrate onto the second electrical contact. Treating causes the solder or conductive adhesive directly above the third electrical contact to migrate onto the third electrical contact.

The example method may include stabilizing the second PCB and the third PCB relative to the first PCB. Stabilizing may include adding stabilizing material to one or more of the following locations: ends of the second PCB and the third PCB that are farthest from the first PCB, where the second PCB and the third PCB intersect the first PCB, where ends of the second PCB and the third PCB terminate within the first PCB, or where ends of the second PCB and the third PCB terminate outside the first PCB.

The first PCB may be or include a device interface board (DIB) of a test system. The DIB may be for providing mechanical and electrical connections between multiple devices under test (DUTs) and test electronics included in the test system. The example method may include changing a capacitance associated with the power layer by adding or removing one or more pairs of PCBs. Each pair may include two PCBs of a type of the second PCB and the third PCB. The example method may include adding a clamp that forces together at least ends of the second PCB and the third PCB that are farthest from the first PCB. Treating the solder or conductive adhesive may include heating the solder to form the electrical connections between the first PCB and the second PCB and between the first PCB and the third PCB. Treating the solder or conductive adhesive may include curing the conductive adhesive to form the electrical connections between the first PCB and the second PCB and between the first PCB and the third PCB. The first capacitors and the second capacitors may be configured to increase capacitance between one or more power layers and one or more ground layers without providing a proportional increase in inductance.

Any two or more of the features described in this specification, including in this summary section, may be combined to form implementations not specifically described in this specification.

At least part of the test systems described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

FIG. 12 is a block diagram showing a front view of an example daughter PCB having solder or conductive adhesive applied to and above its electrical contacts.

FIG. 13 is a block diagram showing a side view of the example daughter PCB of FIG. 12 having solder or conductive adhesive applied to its electrical contacts.

Like reference numerals in different figures indicate like elements.

DETAILED DESCRIPTION

Figure 1:
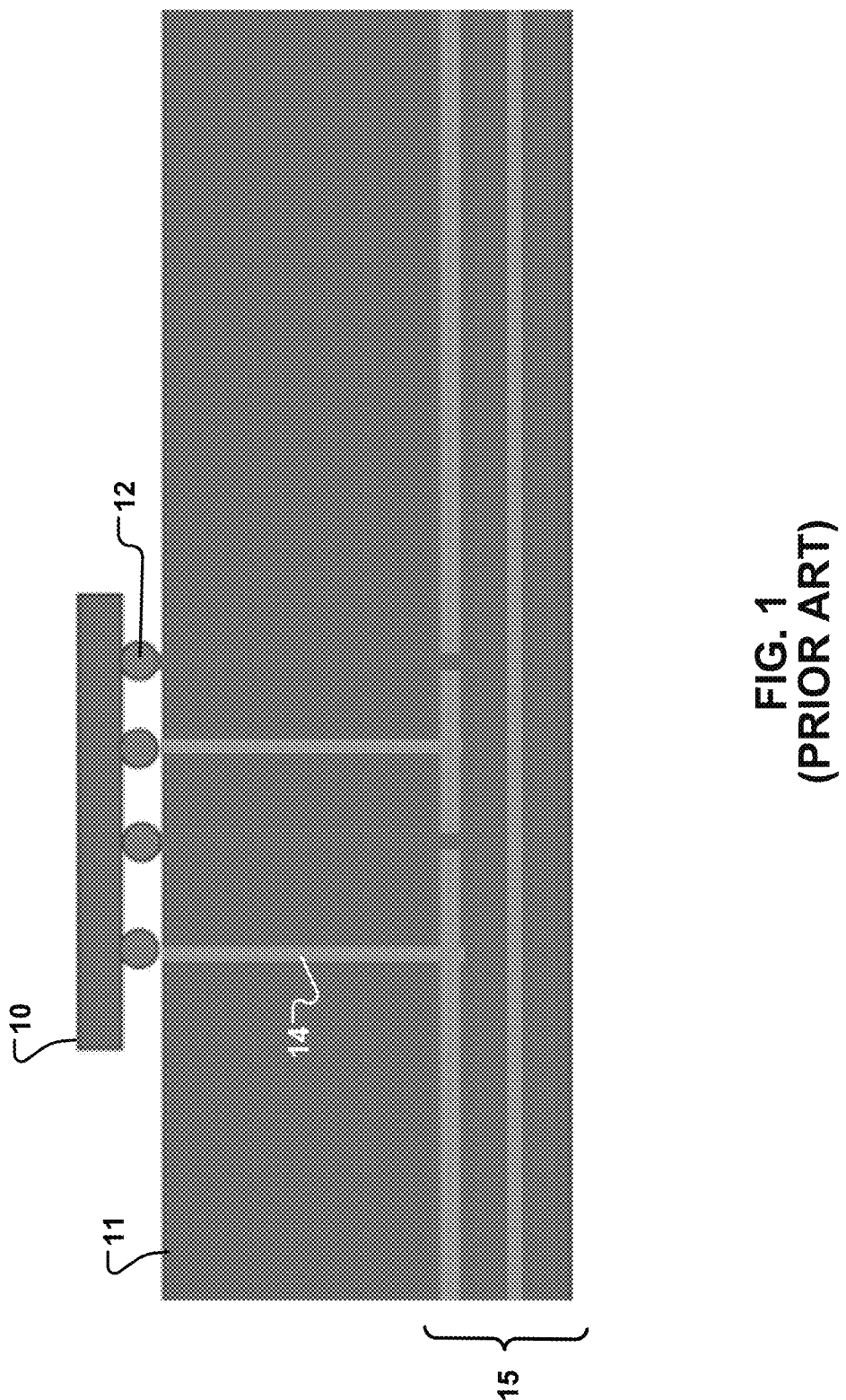
FIG. 1 is a block diagram showing a cut-away side view of an example parallel connection between two printed circuit boards (PCBs).

Described herein are example implementations of printed circuit boards (PCBs) that are configured for non-parallel connections. Non-parallel connections may include orthogonal connections or oblique connections. For example, a first PCB arranged horizontally may include a slot to which a second PCB connects vertically. Power and ground electrical contacts on the first PCB connect electrically to counterpart power and ground electrical contacts on the second PCB. Electronic devices, such as capacitors, may be electrically connected between the power and ground electrical contacts on the second PCB. In an example where capacitors are included on the second PCB, the resulting electrical connection between the first and second PCBs may reduce high-current transients in power applied to devices that are connected to the first PCB.

In an example implementation, an apparatus includes a first PCB having a power layer, a ground layer, and a slot having a first power electrical contact that is electrically connected to the power layer and a first ground electrical contact that is connected to the ground layer. The slot extends orthogonally or obliquely through multiple layers of the first PCB. An example orthogonal slot is at a perpendicular, or 90°, angle relative to the first PCB. An example oblique slot is at an angle relative to the first PCB that is not orthogonal and that is not parallel, for example, between 0° and 90°. The apparatus also includes a second PCB having a second power electrical contact, a second ground electrical contact, and capacitors electrically connected between the second power electrical contact and the second ground electrical contact. The second PCB is configured for insertion into the slot to form an electrical connection between the first power electrical contact and the second power electrical contact and between the first ground electrical contact and the second ground electrical contact.

In the preceding example, the first PCB may be a device interface board (DIB) that is part of a test system such as automatic test equipment (ATE). An example DIB includes mechanical and electrical connections between test instruments configured to conduct tests on devices under test (DUTs) and the DUTs themselves. The second PCB may be a daughter PCB that is configured to connect to the DIB. In this regard, some DUTs, such as microprocessors, artificial intelligence (AI) processors, graphics processors, and automotive power integrated circuits (ICs), may require high-current power during testing. For example, current in the range of hundreds to thousands of amperes (A) may be required during testing. Transients of currents in this range can cause damage to the DUTs, the DIB, and/or the test equipment due to the resultant voltages induced. These voltage changes can also affect DUT testing results. Capacitors may be used to reduce or to eliminate the effects of such current transients. However, given the magnitude of the currents involved, high levels of capacitance may be needed. Board space on the DIB limits the number of capacitors that can be mounted on the DIB.

Accordingly, one or more daughter PCBs containing one or more capacitors may be connected to the DIB orthogonally or obliquely. Such a connection enables additional capacitance to be connected between power and ground layers on the DIB, which may reduce or eliminate voltage deviations during current transients, including high-magnitude current spikes. The amount of capacitance that may be added is flexible and may be controlled by adding or removing daughter PCBs. For example, additional daughter PCBs may be added to the DIB to increase the capacitance. Use of modular daughter PCBs of this type may isolate defects on the daughter PCB, which may make repair easier.

Connections between the DIB and a daughter PCB also may be low resistance and low inductance. In an example, a low resistance connection may include connections in the sub-milliohm range. In an example, a low inductance connection may include a connection that is in the single-digit or double-digit picohenry range. Thus, in some implementations, the daughter PCBs are configured to increase the capacitance between the power layer and the ground layer without providing a proportional or corresponding increase in inductance and/or resistance.

Figure 2:
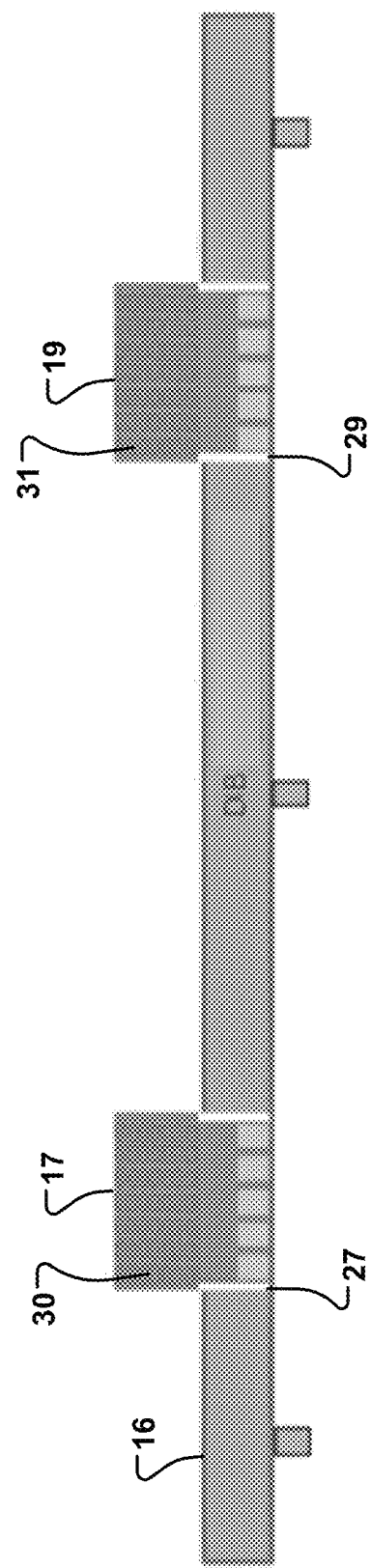
FIG. 2 is a block diagram showing a cut-away front view of example orthogonal connections between two daughter PCBs and a device interface board (DIB).
Figure 3:
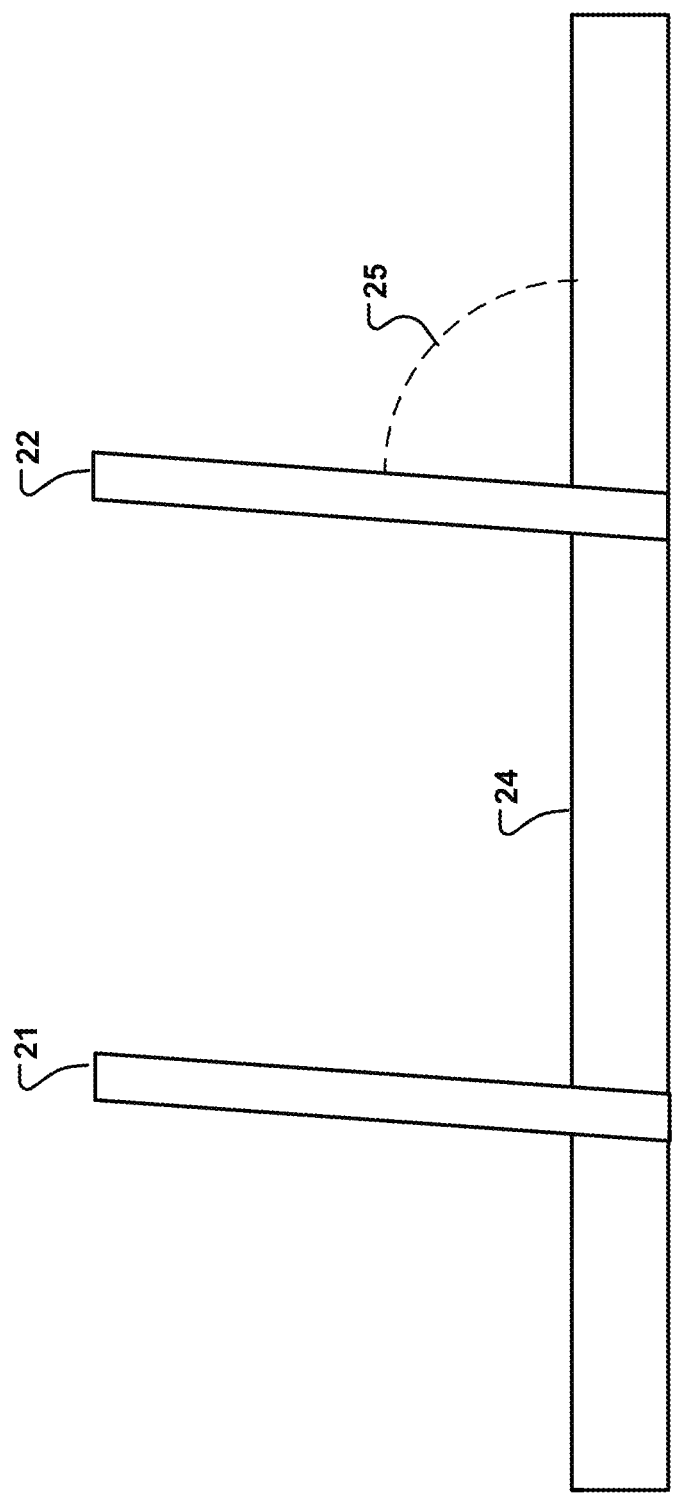
FIG. 3 is a block diagram showing a cut-away side view of example oblique connections between two daughter PCBs and a DIB

FIG. 2 shows an example implementation of two daughter PCBs 17 and 19 connected orthogonally to DIB 16. An example orthogonal connection includes the daughter PCBs 17 and 19 connecting to DIB 16 at a perpendicular, or 90°, angle. Although the examples described with respect to FIGS. 2 and 4 to 14 involve an orthogonal connection, the connections described herein may be oblique rather than orthogonal. An example oblique connection includes daughter PCBs connecting to a DIB at an angle that is not orthogonal and that is not parallel, for example, between 0° and 90°. In an example, FIG. 3 depicts an oblique connection between daughter PCBs 21, 22 and DIB 24. Here, the angle 25 between daughter PCBs 21, 22 and DIB 24 is about 80°; however, any appropriate non-parallel angled connection may be used. In this regard, in some implementations, an oblique connection may include such an angle that is 30° to less than 90°, 40° to less than 90°, 45° to less than 90°, 50° to less than 90°, 60° to less than 90°, 70° to less than 90°, or 80° to less than 90°.

Referring back to FIG. 2, in this example of an orthogonal connection, DIB 16 is arranged horizontally and daughter PCBs 17, 19 connect vertically to the DIB in respective slots 27, 29. Each of slots 27, 29 extends orthogonally through multiple layers of the DIB. In some implementations, the slots may extend all the way through the DIB; and in some implementations the slots may extend only part-way through the DIB. In the example of FIG. 2, each of daughter PCBs 17, 19 includes multiple capacitors 30, 31, respectively. The capacitors on each daughter PCB are connected electrically between one or more ground electrical contacts on the daughter PCB and one or more power electrical contacts on the daughter PCB. An example electrical connection includes uninterrupted serial and/or parallel circuit connections between the capacitors on a daughter PCB and each of the ground electrical contacts and the power electrical contacts on the daughter PCB.

Figure 4:
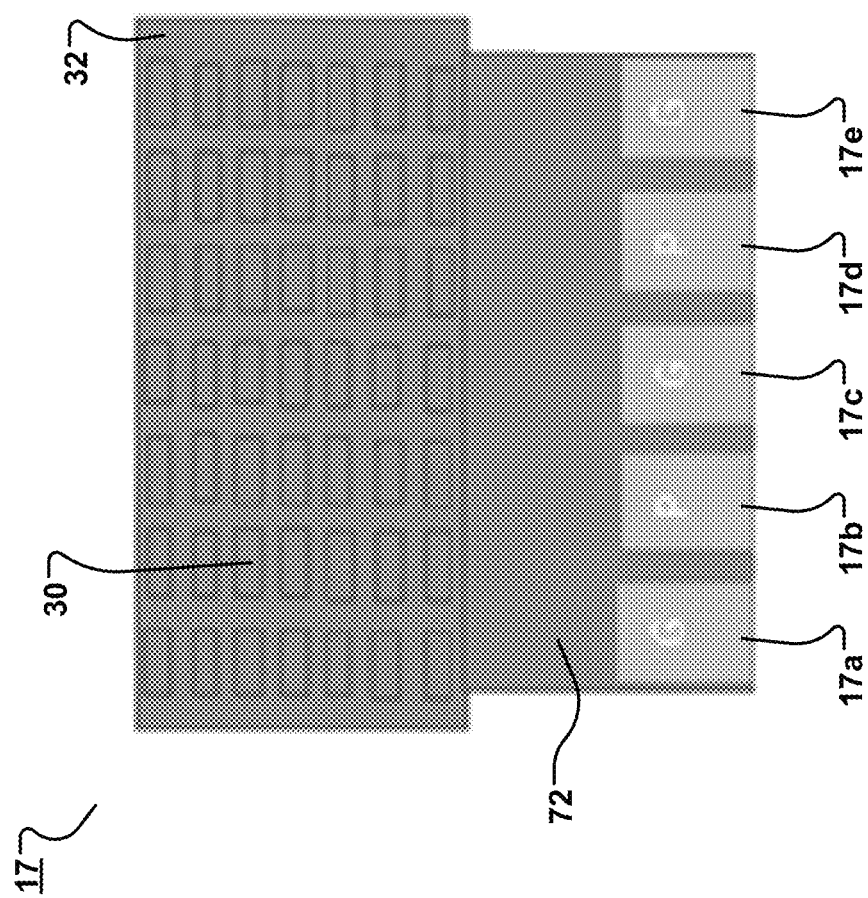
FIG. 4 is a block diagram showing a front view of an example daughter PCB.

FIG. 4 shows a front view of an example configuration of daughter PCB 17. In this example, daughter PCB 17 includes three ground (G) electrical contacts 17a, 17c, and 17e and two power (P) electrical contacts 17b and 17d. Other contact configurations, however, may be used. For example, instead of five total contacts, the daughter PCB may include six total contact, three of which are for power (P) and three of which are for ground (G). The electrical contacts may include an electrically-conductive material such as metal plating. For reasons explained below, in this example electrical contacts 17a to 17e are on only one side 32 of daughter PCB 17. Conductive traces or layers (not shown) run between electrical contacts 17a to 17e and capacitors 30 included on daughter PCB 17. These conductive tracers or layers create the uninterrupted serial and/or parallel circuit connections noted above.

Figure 5:
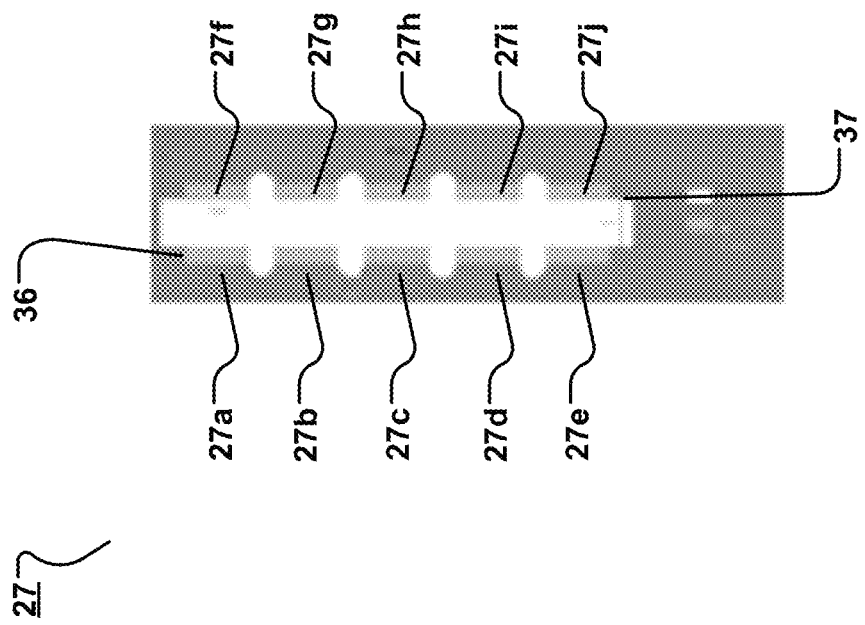
FIG. 5 is a block diagram showing a top view of an example slot through a DIB.
Figure 6:
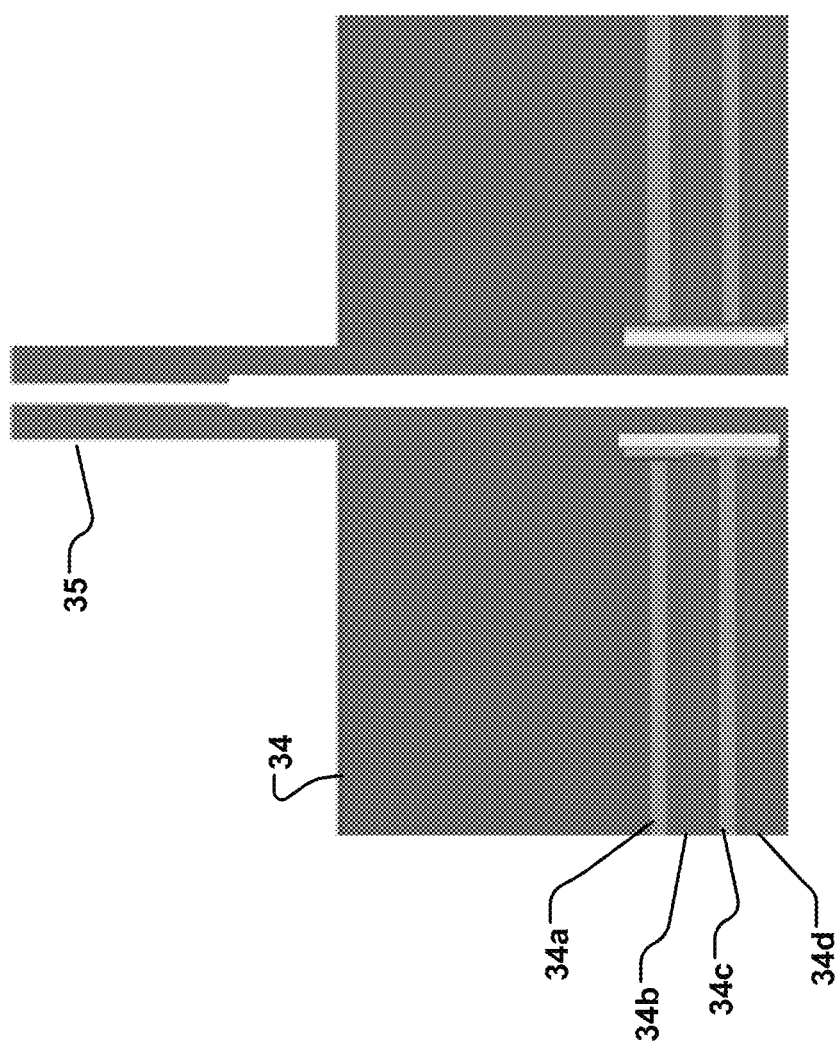
FIG. 6 is a block diagram showing a cut-away side view of an example PCB containing a slot, daughter PCBs connected therein, and power and ground layers.

FIG. 5 shows a top view of an example of configuration of slot 27, into which daughter PCB 17 fits in FIG. 2. Slot 27 includes ground electrical contacts 27a, 27c, and 27e at locations that correspond to and align to the ground electrical contacts of daughter PCB 17. Slot 27 also includes power electrical contacts 27b and 27d at locations that correspond to and align to the ground power contacts of daughter PCB 17. Other contact configurations, however, may be used that match the contact configurations of the daughter PCBs. For example, instead of five total contacts, there may be six total contacts, three of which are for power and three of which are for ground. The power electrical contacts on the DIB electrically connect to one or more of the power layers; and the ground electrical contacts on the DIB electrically connect to an electrical reference. For example, as shown in FIG. 6, a DIB 34 (which may be the same configuration as DIB 16) includes multiple power layers 34a, 34c and multiple ground layers 34b, 34d. The power layers may be connected to one or more voltage or other power sources. The ground layers may be connected to an electrical ground.

Each of the power electrical contacts on the DIB electrically connects to one or more of the power layers 34a, 34c in the DIB; and each of the ground electrical contacts on the DIB electrically connects to one or more of the ground layers 34b, 34d in the DIB. Accordingly, connecting the power electrical contacts on a daughter PCB 35 to the power electrical contacts on the DIB results in electrical connection of capacitors on the daughter PCB to a power layer. Likewise, connecting the ground electrical contacts on the daughter PCB to the ground electrical contacts on the DIB results in electrical connection of capacitors on the daughter PCB to a ground layer. Accordingly, the capacitors on the daughter PCB are connected between power and ground.

Referring back to FIG. 5, example slot 27 is configured to hold two daughter PCBs back-to-back. In this regard, as noted above, example daughter PCB 17 includes electrical contacts 17a to 17e on one side 32 thereof. Those electrical contacts 17a to 17e mate to corresponding electrical contacts 27a to 27e on one side 36 of slot 27. A second daughter PCB having the same configuration as daughter PCB 17 may also fit within slot 27 and connect electrically to electrical contacts 27f to 27j on the other side 37 of slot 17 in the manner described herein. Both the first and second daughter PCBs do not have electrical contacts on the sides facing each other, as shown in FIG. 7.

Figure 7:
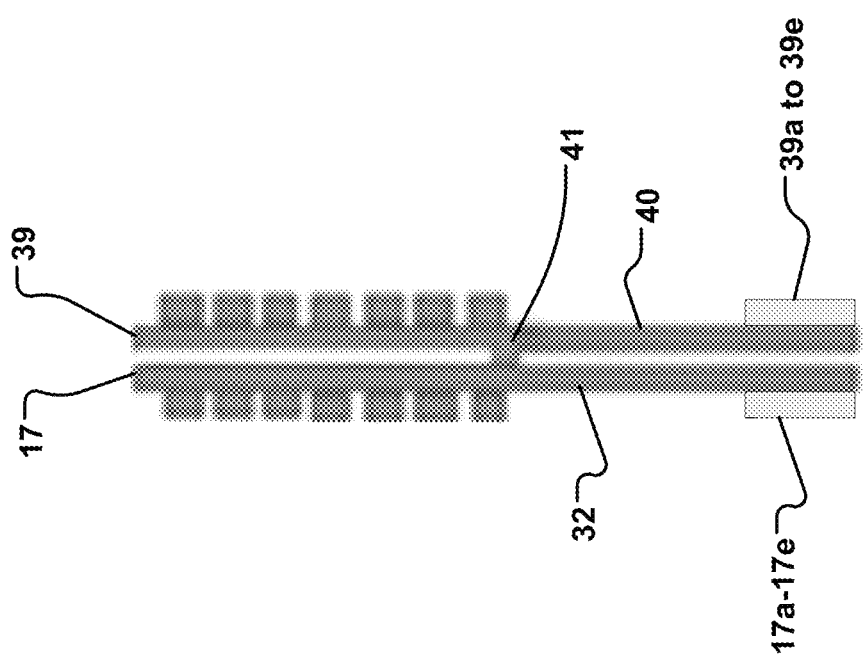
FIG. 7 is a block diagram showing a cut-away side view of two example daughter PCBs in a configuration for connection in a single slot of a DIB.

More specifically, FIG. 7 shows a side view of a first daughter PCB 17 and a second daughter PCB 39 arranged back-to-back as they would be in slot 27. As a result, when the PCBs are in slot 27, electrical contacts 17a to 17e on daughter PCB 17 face away from corresponding electrical contacts 39a to 39e on daughter PCB 39. As shown in FIG. 7, side 32 of daughter PCB 17 contains electrical contacts 17a to 17e that connect electrically to electrical contacts 27a to 27e in slot 27; and side 40 of daughter PCB 39 contains electrical contacts 39a to 39 that connect electrically to corresponding electrical contacts 27f to 27 in slot 27. In this example, a wire 41, which may be a spring or other tension-producing construct, physically connects and separates daughter PCB 17 and daughter PCB 39 for reasons explained below. Wire 41, which may be conductive or non-conductive, does not produce an electrical connection between daughter PCB 17 and daughter PCB 39 in this example.

Although FIG. 5 shows an example slot 27 configured to hold two daughter PCBs in the manner described previously, in some implementations a single slot may be configured to hold a single daughter PCB only. Thus, a DIB may include multiple slots, each configured to receive only one daughter PCB or two daughter PCBs. In some implementations, a DIB may include one or more slots configured to receive only one daughter PCB and one or more slots configured to receive two daughter PCBs. The daughter PCBs are addable to or removable from the slots to change a capacitance associated with one or more power layers in the DIB as described herein. In some implementations, the same slot may be configured to receive and to hold back-to-back two daughter PCBs having different configurations, for example, different electrical contacts to different signal, ground, and/or power layers on the DIB.

Electrical connections between electrical contacts on a daughter PCB and electrical contacts on the DIB may be implemented by adding solder or conductive adhesive between the respective electrical contacts followed by appropriate treatment operations to implement the electrical connection such as solder reflow in the case of solder or curing in the case of conductive adhesive. For example, the solder or conductive adhesive may be applied to the power electrical contacts and the ground electrical contacts on a daughter PCB before the daughter PCB is inserted into a slot. For example, the solder or conductive adhesive may be applied to the power electrical contacts and the ground electrical contacts in the slot on the DIB before the daughter PCB is inserted into the slot. An example process for assembling an apparatus that includes the DIB and two daughter PCBs in a slot is described below.

Figure 8:
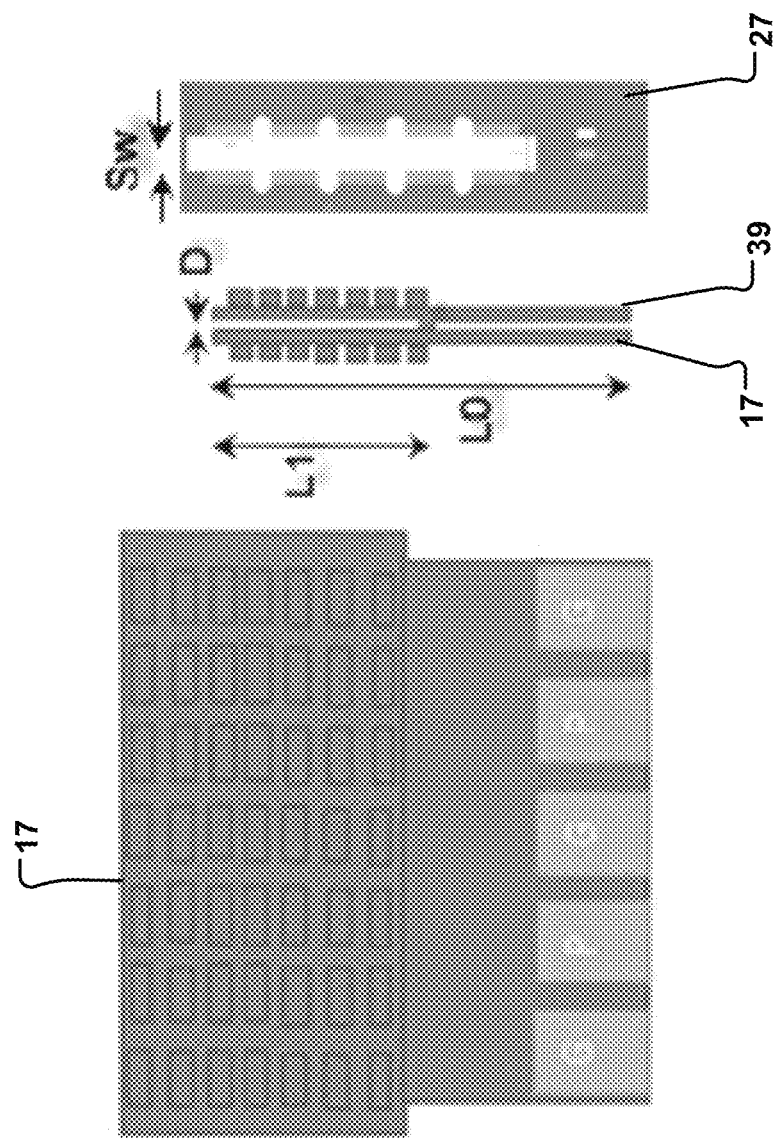
FIG. 8 is a block diagram showing the components of FIGS. 4, 5, and 7 and dimensions thereof having labels.

Referring to FIG. 8, which reproduces the components of FIGS. 4, 5, and 7, the following dimensional relationships apply.

L0=total length of a daughter PCB
L1=distance from daughter PCB top to separator wire 41
Sw=slot 27 width
T=daughter PCB thickness
D=diameter of separator wire
G=gap to reach for each side of slot 27
G=(Sw−2*T−D)/2
D/(2*L1)=G/[L0−L1]

The preceding equations define, for an example configuration, the dimensional relationships between slot width (Sw), daughter PCB thickness (T), the diameter of separator wire (D), the length of the daughter PCB (L0), the location of the separator wire (L1), and the gap to reach per side (G) of the slot.

Figure 9:
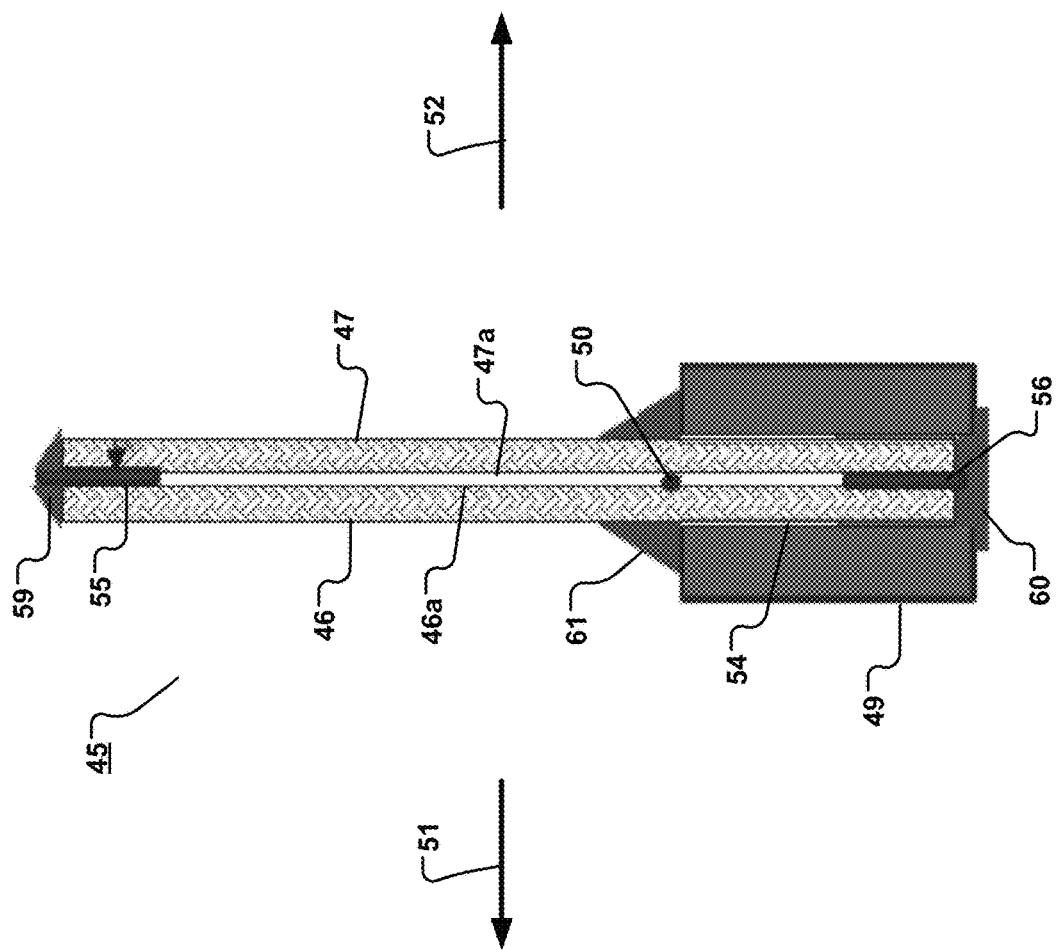
FIG. 9 is a block diagram showing a cut-away side view of an example orthogonal connection between a DIB and two daughter PCBs.

FIG. 9 shows an example apparatus 45 comprised of two daughter PCBs 46, 47 and a DIB 49, which may be components of the types described with respect to FIGS. 2 to 8. In this example, the electrical connections between each daughter PCB and the DIB are as described previously. Sides 46a and 47a of the daughter PCBs that are devoid of electrical contacts face each other as shown. These sides 46a, 47a are separated by a wire 50, such as a spring, that does not create an electrical connection but that rather forces daughter PCBs 46 and 47 apart in the directions of arrows 51 and 52 in order to support and to tighten connections between electrical contacts on daughter PCBs 46, 47 and the electrical contacts in the slot 54 of DIB 49.

In the example of FIG. 9, apparatus 45 includes spacers 55, 56 that are between the sides 46a, 47a of daughter PCBs 46, 47 that are devoid of electrical contacts. The spacers do not implement electrical connections. Instead, the spacers help to stabilize the daughter PCBs and to keep the daughter PCBs forced apart and thereby force the electrical contacts of the daughter PCBs 46, 47 against the electrical contacts of the DIB 49. Spacers 55, 56 may be made of any appropriate material, such as plastic or metal. In the example of FIG. 9, spacers 55, 56 extend part-way between the two daughter PCBs. For example, a spacer may extend along 10% of the length of the daughter PCBs, 20% of the length of the daughter PCBs, 30% of the length of the daughter PCBs, and so forth up to the entirety of the length of the daughter PCBs. Furthermore, although two spacers are shown, there may be no spacers, a single spacer, three spacers, or more than three spacers between daughter PCBs 46, 47.

Apparatus 45 also includes stabilizing material located at one or more of the following locations: at ends of the daughter PCBs that are not within the DIB and that are farthest from where the daughter PCBs intersect the DIB (stabilizer 59), at ends of the daughter PCBs that terminate within the DIB (stabilizer 60), or where the daughter PCBs first meet with or intersect the DIB (stabilizer 61). The stabilizer may be or include an adhesive such as Loctite®, other types of glue, or any other appropriate material that may be used to hold together components of apparatus 45. In some implementations, such as that described with reference to FIG. 10, there may be a physical clamp (not shown in FIG. 9) at the ends of the daughter PCBs that are not within the DIB and that are farthest from where the daughter PCBs intersect the DIB.

Figure 10:
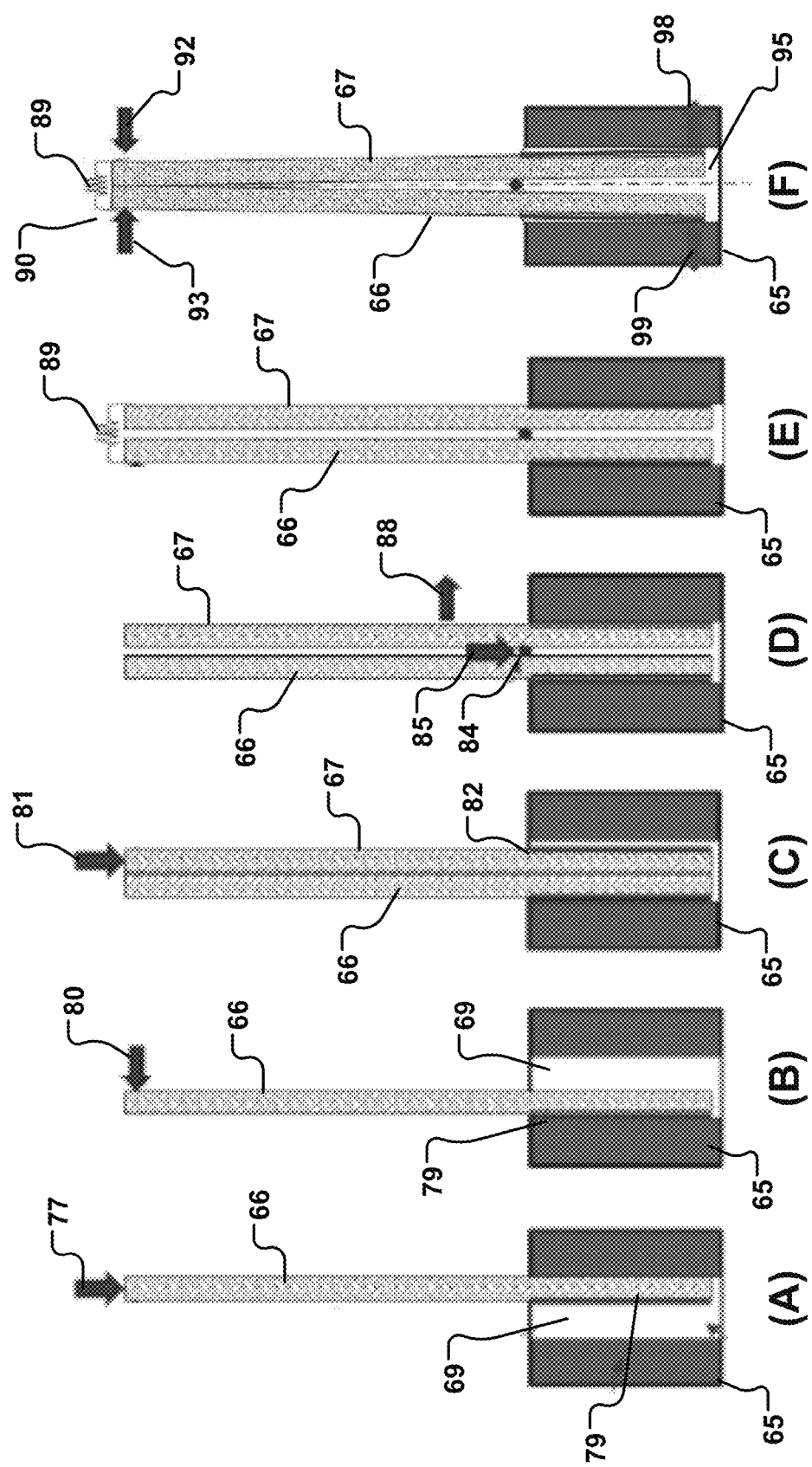
FIG. 10 includes block diagrams showing an example sequence of operations for creating an orthogonal connection between a DIB and two daughter PCBs, which are shown in cross-sectional cut-away views.

FIG. 10 depicts operations (A) through (F) included in an example process for assembling an apparatus, which may be the same as or similar to apparatus 45 and which includes a DIB 65 and two daughter PCBs 66, 67 in a slot 69 such as slot 27 of FIG. 5. In this example, prior to assembly, a solder paste or conductive adhesive is applied to the ground and power pads on each daughter PCB. The solder paste or conductive adhesive should be applied so as not to create a short circuit between adjacent pads. In other examples, the solder or conductive adhesive may be applied to the electrical contacts in the slots and not to those on the daughter PCBs. In other examples, the solder or conductive adhesive may be applied to the electrical contacts in the slots and also to the electrical contacts on the daughter PCBs.

Figure 11:
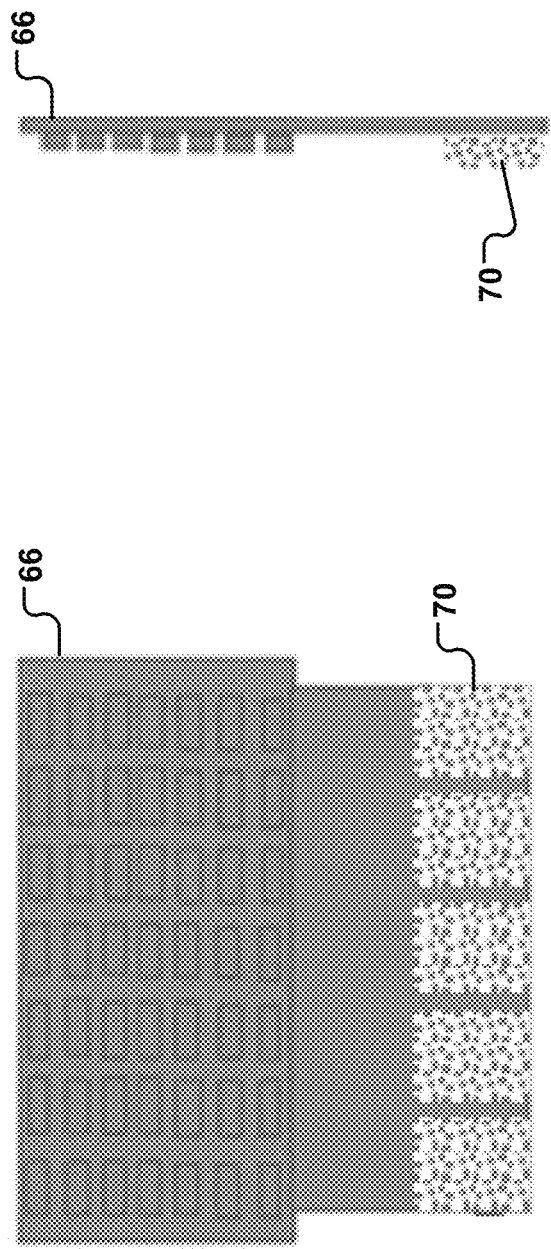
FIG. 11 includes block diagrams showing a front view of an example daughter PCB having solder or conductive adhesive applied thereto, and a side view of the example daughter PCB having solder or conductive adhesive applied thereto.

Referring to operation (A), daughter PCB 66 of the type shown in FIG. 4 is inserted into slot 69 in DIB 65. Slot 69 extends orthogonally through multiple layers of DIB 69, which may include layers like those of FIG. 6. These multiple layers include one or more power layers and one or more ground layers as described previously. One or more signal layers may also be included. Power and ground electrical contacts on daughter PCB 66 contain solder or conductive adhesive in this example. FIG. 11 shows front and side views of daughter PCB 66 containing solder or conductive adhesive 70 on its electrical contacts (electrical pads in this example). In some implementations, as shown in FIG. 4, a daughter PCB may include a non-conductive area 72 above its electrical contacts 17a to 17e. Solder or conductive adhesive may be applied to regions above the electrical contacts prior to treating—for example, prior to solder reflow (heating) or curing as described below with respect to FIG. 12.

In operation (A), daughter PCB 66 is inserted into slot 69 in the direction of arrow 77 such that its electrical contacts 79 containing solder or conductive adhesive are away from but face and align to corresponding electrical contacts (not shown) in slot 69. In operation (B), daughter PCB 66 is moved in the direction of arrow 80 so as to force its electrical contacts 79 containing solder or conductive adhesive against corresponding electrical contacts (not shown) in slot 69. In operation (C), daughter PCB 67 is inserted into slot 69 in the direction of arrow 81 such that its electrical 82 containing solder or conductive adhesive face and align to, but are away from, corresponding electrical contacts (not shown) in slot 69. When inserted into slot 69, the side of daughter PCB 67 that is devoid of electrical contacts faces the side of daughter PCB 66 that is devoid of electrical contacts, as described with respect to FIG. 7.

In operation (D), the process includes forcing daughter PCB 67 and its electrical contacts against the side of slot 69 and its counterpart electrical contacts, while simultaneously forcing daughter PCB 67 away from daughter PCB 66. This may be done by inserting a wire 84, such as a conductive or nonconductive spring, between daughter PCB 66 and daughter PCB 67 in the direction of arrow 85. The wire forces the electrical contacts of daughter PCB 67 (which contain solder or conducive adhesive) against the corresponding electrical contacts of slot 69 in the direction of arrow 88. The wire also may further force the electrical contacts of daughter PCB 66 (which contain solder or conducive adhesive) against the corresponding electrical contacts of slot 69.

In addition to the wire, one or more spacers of the type shown, for example, in FIG. 9 may be forced between the sides of daughter PCBs 66 and 67 that are devoid of electrical connections. The spacers may operate to stabilize the daughter PCBs and to force the electrical contacts of the daughter PCBs against corresponding electrical contacts of the slot and to retain force against the resulting connections. In some implementations, one or more of the spacers or all of the spacers may be omitted. In some implementations, one or more of the spacers or all of the spacers may be added after solder reflow or curing is performed, as described below.

In operation (E), a clamp 89 may be physically connected to daughter PCBs 66 and 67 at or near the ends of the daughter PCBs that are not within the DIB and that are farthest from the DIB 65. When operated, as shown in operation (F), clamp 89 may force the ends 90 of the daughter PCBs together in the direction of arrows 92, 93. This force at ends 90 of the daughter PCBs forces the other ends 95 of the daughter PCBs to move outward in the direction of arrows 98 and 99. This force at ends 95 of the daughter PCBs further forces the electrical contacts on the daughter PCBs against corresponding electrical contacts in slot 69.

Following the physical connections made in through operations (A) to (F), the solder or conductive adhesive on the daughter PCBs' electrical contacts is treated to implement—for example, to form, to improve, to perfect, and/or to complete—electrical connections between the daughter PCBs' electrical contacts and counterpart electrical contacts on the slot. In implementations where solder is used, treating may include performing a solder reflow process, which includes heating the solder. In implementations where conductive adhesive is used, treating may include curing the conductive adhesive. In either case, the solder or conductive adhesive is applied and treated along lateral dimensions of the PCBs; for example vertically within the slots.

In implementations that includes solder or conductive adhesive applied to regions 100 above the electrical contacts prior to treating as shown in FIG. 12, the treating process may cause the solder or conductive adhesive to migrate—for example, to melt and to move—to the contact below the solder or conductive adhesive. This is shown in FIG. 13, where the additional solder or conducive adhesive accumulates 101 at the electrical contact below the non-conductive region where it was originally applied. This resulting additional solder or conductive adhesive may improve the electrical connection between the electrical contacts on the daughter PCB and the slot.

Following treatment, the spacers may be added and the stabilizer may be applied as shown in FIG. 9. The spacers and the stabilizer may reinforce the resulting structure and thereby reduce the chances that it will be damaged during use.

In some implementations, solder paste can be reflowed onto the daughter PCB electrical contacts prior to inserting the daughter PCB into the slot on the DIB. If so, the daughter PCBs may need to be treated for removal of metal oxide prior to assembly.

Figure 14:
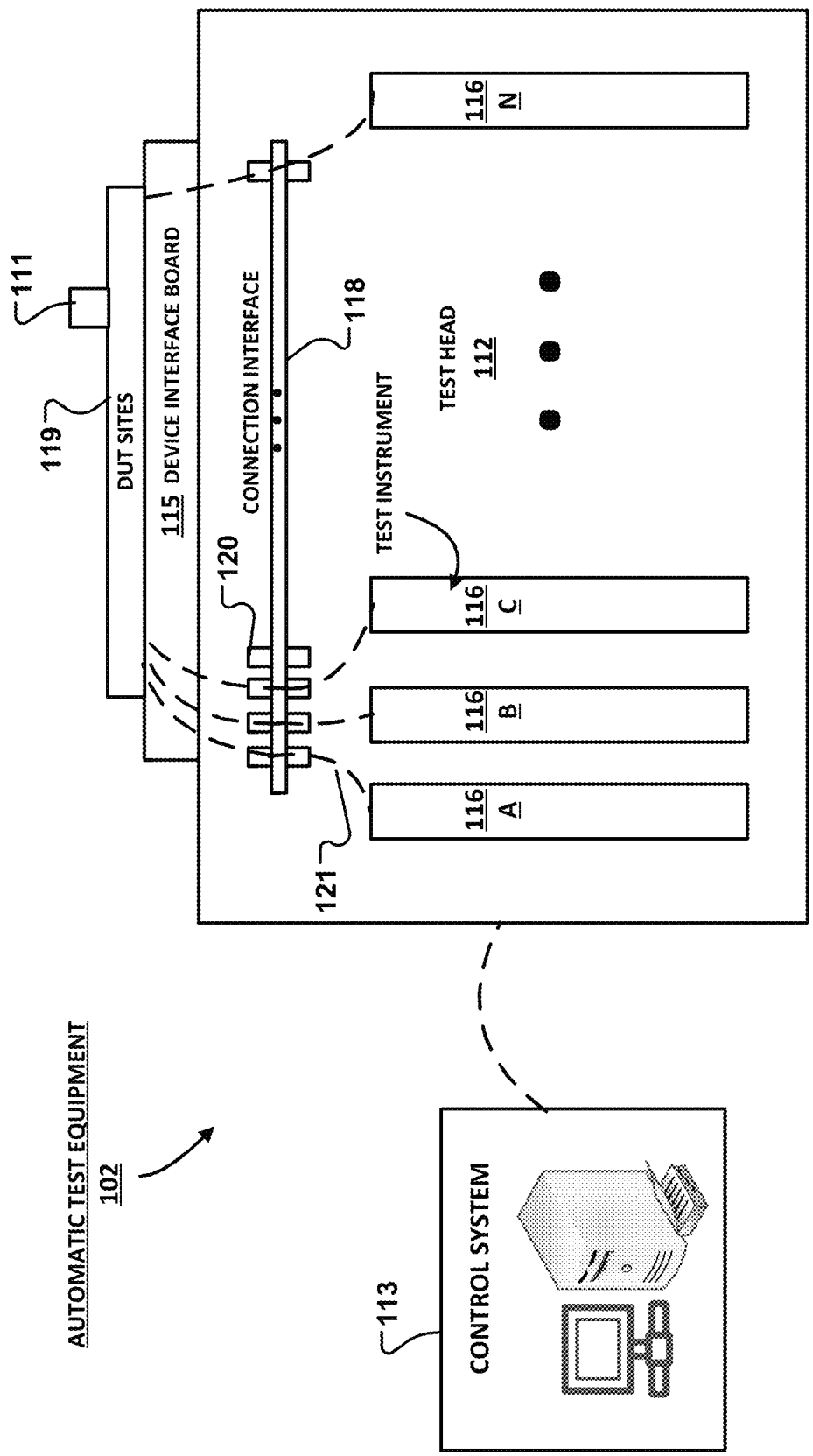
FIG. 14 is a block diagram showing components of an example test system on which the PCB connection techniques described herein may be implemented.

FIG. 14 shows components of example ATE 102 that includes a DIB to which non-parallel PCB connections may be made as described herein. In FIG. 14, the dashed lines represent, conceptually, potential signal paths between components of the system.

ATE 102 includes a test head 112 and a control system 113. The control system may include a computing system comprised of one or more microprocessors or other appropriate processing devices as described herein. DIB 115 includes a PCB that is connected to test head 112 and that includes mechanical and electrical interfaces to one or more DUTs, such as DUT 111, that are being tested or are to be tested by the ATE. Power, including voltage, may be run via one or more layers in the DIB to DUTs connected to the DIB. DIB 115 also may include one or more ground layers and one or signal layers with connected vias for transmitting signals to the DUTs. As described with respect to FIGS. 2 to 13, DIB 115 may include multiple slots that extend orthogonally all-the-way or part-way through the DIB, multiple slots that extend obliquely all-the-way or part-way through the DIB, or multiple slots including some slots that extend orthogonally all-the-way or part-way through the DIB and some slots that extend obliquely all-the-way or part-way through the DIBs. Each of these slots may hold one daughter PCB or two daughter PCBs of the types described herein. The daughter PCBs are addable to, and removable from, the DIB to change the capacitance connected to power layer(s) and ground layer(s). Adding a daughter PCB to the DIB may increase the capacitance connected to the power and ground layers of the DIB and removing a daughter PCB may decrease the capacitance connected to the power and ground layers of the DIB. In some implementations, the daughter PCBs are addable to, and removable from, the DIB to change the capacitance connected to one or more of the signal layers. In some implementations, the daughter PCBs are addable to, and removable from, the DIB to change an electrical parameter other than capacitance associated with the power layer(s), the ground layer(s), and/or the signal layer(s).

In the example of FIG. 14, DIB 115 connects, electrically and mechanically, to test head 112. The DIB includes sites 119, which may include pins, conductive traces, or other points of electrical and mechanical connection to which the DUTs may connect. Test signals and response signals, such as radio frequency (RF) signals, and other signals pass via test channels over the sites between the DUTs and test instruments. DIB 115 may also include, among other things, connectors, conductive traces, conductive layers, and circuitry for routing signals between the test instruments, DUTs connected to sites 119, and other circuitry.

Control system 113 communicates with components included in the test head to control testing. For example, control system 113 may download test program sets to test instruments 116A to 116N in the test head. The test instruments include hardware devices that may include one or more processing devices and other circuitry. Test instruments 116A to 116N may run the test program sets to test DUTs in communication with the test instruments. Control system 113 may also send, to test instruments in the test head, instructions, test data, and/or other information that are usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

In an example, a test program generates a test flow to provide to the DUT. The test flow is written to output test signals to elicit a response from the DUT, for example. As noted, the test signals and the response from the DUT may include RF signals.

In the example of FIG. 14, ATE 102 includes multiple test instruments 116A to 116N, each of which may be configured, as appropriate, to perform one or more of testing and/or other functions. Although only four test instruments are depicted, the system may include any appropriate number of test instruments, including those residing outside of test head 112. In some implementations, each test instrument may be configured to output digital or RF signals to test a DUT based, e.g., on data provided by the control system, and to receive digital or RF response signals from the DUT. Different test instruments may be configured to perform different types of tests and/or be configured to test different DUTs. For example, the test instruments may include an RF test instrument 116B to send RF test signals to a DUT and to receive RF response signals from the DUT. The received signals may include RF response signals that are based on the test signals and/or signals that originate from the DUT that are not prompted by (e.g., are not in response to) test signals. In some implementations, there may be electrical conductors, such as coaxial wires, between the DUT, the DIB, and the test instrument interfaces over which test and response signals are sent.

Signals, including RF signals, may be sent to, and received from, the DUT over multiple test channels or other electrically conductive media. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media. A test channel may include and/or electrically connect to a conductive trace on the DIB. A test channel may also include hardware on the test instrument for receiving and digitizing signals.

In some examples, ATE 102 includes a connection interface 118 that connects test instrument test channels 121 to DIB 115. Connection interface 118 may include connectors 120 or other devices for routing signals between the test instruments and DIB 115. For example, the connection interface may include one or more circuit boards or other substrates on which such connectors are mounted. Conductors that are included in the test channels may be routed through the connection interface and the DIB.

The techniques described herein may be used in PCBs other than DIBs. For example, a PCB containing passive electronic components (e.g., capacitors, resistors, inductors), active electronic components (e.g., relays or transistors), or both passive and active electronic components may be inserted into an orthogonal or oblique slot of a PCB in a test instrument. For example, a PCB containing passive electronic components, active electronic components, or both passive and active electronic components may be inserted into an orthogonal or oblique slot of a PCB in a probe card.

Although the implementations described herein are in the context of testing, the techniques described herein may be used outside of a testing context. For example, a PCB containing passive electronic components, active electronic components, or both passive and active electronic components may be inserted into an orthogonal or oblique slot of any other appropriate PCB motherboard. The resulting electrical connections as described herein may be used to affect transients or other attributes of power signals or non-power signals or to otherwise condition, process, or change the signals.

All or part of the test systems and processes described in this specification and their various modifications may be configured or controlled at least in part by one or more computers such as control system 113 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. An apparatus comprising:
    a first printed circuit board (PCB) comprising a power layer, a ground layer, and a slot comprising a first power electrical contact that is electrically connected to the power layer and a first ground electrical contact that is connected to the ground layer, the slot extending orthogonally or obliquely through multiple layers of the first PCB; and
    a second PCB comprising a second power electrical contact, a second ground electrical contact, and capacitors electrically connected between the second power electrical contact and the second ground electrical contact, the second PCB being configured for insertion into the slot to form an electrical connection between the first power electrical contact and the second power electrical contact and between the first ground electrical contact and the second ground electrical contact;

wherein the first PCB comprises multiple slots including the slot, each of the multiple slots being configured to receive a PCB having capacitors electrically connected between a power electrical contact and aground electrical contact, where PCBs are addable or removable from the multiple slots to change a capacitance associated with one or more power layers in the first PCB.

2. The apparatus of claim 1, wherein the capacitors on each PCB are configured to increase capacitance between the power layer and the ground layer without providing a proportional increase in inductance.

3. The apparatus of claim 1, wherein the power layer is a first power layer and the first PCB comprises a second power layer and a fourth power electrical contact that is electrically connected to the second power layer;
   wherein the ground layer is a first ground layer and the first PCB comprises a second ground layer and a fourth ground electrical contact that is electrically connected to the second ground layer;
   wherein the apparatus comprises a third PCB comprising a third power electrical contact, a third ground electrical contact, and capacitors electrically connected between the third power electrical contact and the third ground electrical contact; and
   wherein the third PCB is configured for insertion into the slot along with the second PCB to form an electrical connection between the third power electrical contact and the fourth power electrical contact and between the third ground electrical contact and the fourth ground electrical contact.

4. The apparatus of claim 3, further comprising:
   solder or conductive adhesive between the first power electrical contact and the second power electrical contact, the solder or conductive adhesive for creating at least part of the electrical connection between the first power electrical contact and the second power electrical contact;
   solder or conductive adhesive between the third power electrical contact and the fourth power electrical contact, the solder or conductive adhesive for creating at least part of the electrical connection between the third power electrical contact and the fourth power electrical contact;
   solder or conductive adhesive between the first ground electrical contact and the second ground electrical contact, the solder or conductive adhesive for creating at least part of the electrical connection between the first ground electrical contact and the second ground electrical contact; and
   solder or conductive adhesive between the third ground electrical contact and the fourth ground electrical contact, the solder or conductive adhesive for creating at least part of the electrical connection between the third ground electrical contact and the fourth ground electrical contact.

5. The apparatus of claim 1, wherein the first PCB comprises a device interface board (DIB) of a test system, the DIB for providing mechanical and electrical connections between multiple devices under test (DUTs) and test electronics included in the test system.

6. The apparatus of claim 1, wherein each of the multiple slots is configured to receive only one PCB of a same type as the second PCB.

7. An apparatus comprising:
   a first printed circuit board (PCB) comprising a power layer, a ground layer, and a slot comprising a first power electrical contact that is electrically connected to the power layer and a first ground electrical contact that is connected to the ground layer, the slot extending orthogonally or obliquely through multiple layers of the first PCB; and
   a second PCB comprising a second power electrical contact, a second ground electrical contact, and capacitors electrically connected between the second power electrical contact and the second ground electrical contact, the second PCB being configured for insertion into the slot to form an electrical connection between the first power electrical contact and the second power electrical contact and between the first ground electrical contact and the second ground electrical contact;
   wherein the power layer is a first power layer and the first PCB comprises a second power layer and a fourth power electrical contact that is electrically connected to the second power layer;
   wherein the ground layer is a first ground layer and the first PCB comprises a second ground layer and a fourth ground electrical contact that is electrically connected to the second ground layer;
   wherein the apparatus comprises a third PCB comprising a third power electrical contact, a third ground electrical contact, and capacitors electrically connected between the third power electrical contact and the third ground electrical contact;
   wherein the third PCB is configured for insertion into the slot along with the second PCB to form an electrical connection between the third power electrical contact and the fourth power electrical contact and between the third ground electrical contact and the fourth ground electrical contact;
   wherein the first PCB comprises multiple power layers, multiple ground layers, multiple power electrical contacts each electrically connected to a power layer, and multiple ground electrical contacts each electrically connected to a ground layer;
   wherein the second PCB comprises multiple power electrical contacts each for making an electrical connection to one of the power electrical contacts on the first PCB when the second PCB is in the slot in the first PCB;
   wherein the second PCB comprises multiple ground electrical contacts each for making an electrical connection to one of the ground electrical contacts on the first PCB when the second PCB is in the slot in the first PCB;
   wherein the third PCB comprises multiple power electrical contacts each for making an electrical connection to one of the power electrical contacts on the first PCB when the third PCB is in the slot in the second PCB; and
   wherein the third PCB comprises multiple ground electrical contacts each for making an electrical connection to one of the ground electrical contacts on the first PCB when the third PCB is in the slot in the second PCB.

8. An apparatus comprising:
   a first printed circuit board (PCB) comprising a power layer, a ground layer, and a slot comprising a first power electrical contact that is electrically connected to the power layer and a first ground electrical contact that is connected to the ground layer, the slot extending orthogonally or obliquely through multiple layers of the first PCB; and
   a second PCB comprising a second power electrical contact, a second ground electrical contact, and capacitors electrically connected between the second power electrical contact and the second ground electrical contact, the second PCB being configured for insertion into the slot to form an electrical connection between the first power electrical contact and the second power electrical contact and between the first ground electrical contact and the second ground electrical contact;

wherein the power layer is a first power layer and the first PCB comprises a second power layer and a fourth power electrical contact that is electrically connected to the second power layer;

wherein the ground layer is a first ground layer and the first PCB comprises a second ground layer and a fourth ground electrical contact that is electrically connected to the second ground layer;

wherein the apparatus comprises a third PCB comprising a third power electrical contact, a third ground electrical contact, and capacitors electrically connected between the third power electrical contact and the third ground electrical contact;

wherein the third PCB is configured for insertion into the slot along with the second PCB to form an electrical connection between the third power electrical contact and the fourth power electrical contact and between the third ground electrical contact and the fourth ground electrical contact;

wherein, in the slot, the second power electrical contact and the third power electrical contact face away from each other and towards, respectively, the first power electrical contact and the fourth power electrical contact.

9. An apparatus comprising:

a first printed circuit board (PCB) comprising a power layer a ground layer, and a slot comprising a first power electrical contact that is electrically connected to the power layer and a first ground electrical contact that is connected to the ground layer, the slot extending orthogonally or obliquely through multiple layers of the first PCB; and a second PCB comprising a second power electrical contact, a second ground electrical contact, and capacitors electrically connected between the second power electrical contact and the second ground electrical contact, the second PCB being configured for insertion into the slot to form an electrical connection between the first power electrical contact and the second power electrical contact and between the first ground electrical contact and the second ground electrical contact;

wherein the power layer is a first power layer and the first PCB comprises a second power layer and a fourth power electrical contact that is electrically connected to the second power layer;

wherein the ground layer is a first ground layer and the first PCB comprises a second ground layer and a fourth ground electrical contact that is electrically connected to the second ground layer;

wherein the apparatus comprises a third PCB comprising a third power electrical contact, a third ground electrical contact, and capacitors electrically connected between the third power electrical contact and the third ground electrical contact;

wherein the third PCB is configured for insertion into the slot along with the second PCB to form an electrical connection between the third power electrical contact and the fourth power electrical contact and between the third ground electrical contact and the fourth ground electrical contact;

wherein the second PCB has a first side containing the second power electrical contact and a second side devoid of electrical contacts, and the third PCB has a third side containing the third power electrical contact and a fourth side devoid of electrical contacts; and wherein, in the slot, the second side of the second PCB and the fourth side of the third PCB face each other and are separated by at least one spacer.

10. An apparatus comprising:

a first printed circuit board (PCB) comprising a power layer, a ground layer, and a slot comprising a first power electrical contact that is electrically connected to the power layer and a first ground electrical contact that is connected to the ground layer, the slot extending orthogonally or obliquely through multiple layers of the first PCB; and a second PCB comprising a second power electrical contact, a second ground electrical contact, and capacitors electrically connected between the second power electrical contact and the second ground electrical contact, the second PCB being configured for insertion into the slot to form an electrical connection between the first power electrical contact and the second power electrical contact and between the first ground electrical contact and the second ground electrical contact;

wherein the power layer is a first power layer and the first PCB comprises a second power layer and a fourth power electrical contact that is electrically connected to the second power layer;

wherein the ground layer is a first ground layer and the first PCB comprises a second ground layer and a fourth ground electrical contact that is electrically connected to the second ground layer;

wherein the apparatus comprises a third PCB comprising a third power electrical contact, a third ground electrical contact, and capacitors electrically connected between the third power electrical contact and the third ground electrical contact;

wherein the third PCB is configured for insertion into the slot along with the second PCB to form an electrical connection between the third power electrical contact and the fourth power electrical contact and between the third ground electrical contact and the fourth ground electrical contact;

wherein the second PCB has a first side containing the second power electrical contact and a second side devoid of electrical contacts, and the third PCB has a third side containing the third power electrical contact and a fourth side devoid of electrical contacts; and wherein, in the slot, the second side of the second PCB and the fourth side of the third PCB face each other and are separated by a wire that forces apart the second PCB and the third PCB.

11. An apparatus comprising:

a first printed circuit board (PCB) comprising a power layer, a ground layer, and a slot comprising a first power electrical contact that is electrically connected to the power layer and a first ground electrical contact that is connected to the ground layer, the slot extending orthogonally or obliquely through multiple layers of the first PCB; and a second PCB comprising a second power electrical contact, a second ground electrical contact, and capacitors electrically connected between the second power electrical contact and the second ground electrical contact, the second PCB being configured for insertion into the slot to form an electrical connection between the first power electrical contact and the second power electrical contact and between the first ground electrical contact and the second ground electrical contact;

wherein the power layer is a first power layer and the first PCB comprises a second power layer and a fourth power electrical contact that is electrically connected to the second power layer;

wherein the ground layer is a first ground layer and the first PCB comprises a second ground layer and a fourth ground electrical contact that is electrically connected to the second ground layer;

wherein the apparatus comprises a third PCB comprising a third power electrical contact, a third ground electrical contact, and capacitors electrically connected between the third power electrical contact and the third ground electrical contact;

wherein the third PCB is configured for insertion into the slot along with the second PCB to form an electrical connection between the third power electrical contact and the fourth power electrical contact and between the third ground electrical contact and the fourth ground electrical contact; and wherein the apparatus further comprises:

stabilizing material located at one or more of the following locations: ends of the second PCB and the third PCB that are farthest from the first PCB, where the second PCB and the third PCB intersect the first PCB, or where ends of the second PCB and the third PCB terminate within the first PCB.

12. An apparatus comprising:

a first printed circuit board (PCB) comprising a power layer, a ground layer, and a slot comprising a first power electrical contact that is electrically connected to the power layer and a first ground electrical contact that is connected to the ground layer, the slot extending orthogonally or obliquely through multiple layers of the first PCB; and a second PCB comprising a second power electrical contact, a second ground electrical contact, and capacitors electrically connected between the second power electrical contact and the second ground electrical contact, the second PCB being configured for insertion into the slot to form an electrical connection between the first power electrical contact and the second power electrical contact and between the first ground electrical contact and the second ground electrical contact;

wherein the first PCB comprises multiple slots including the slot, each of the multiple slots being configured to receive two PCBs of a same type as the second PCB, where PCBs are addable or removable from the slots to change a capacitance associated with one or more power layers in the first PCB.

13. A method comprising:

inserting a second printed circuit board (PCB) into a slot in a first PCB, the slot extending orthogonally or obliquely through multiple layers of the first PCB, the second PCB comprising a second electrical contact containing solder or conductive adhesive, the first PCB comprising a first electrical contact in the slot that aligns to the second electrical contact at least in part when the second PCB is in the slot, the slot comprising a hole that extends at least part-way through the first PCB;

forcing the second electrical contact containing solder or conductive adhesive against the first electrical contact;

inserting a third printed circuit board (PCB) into the slot in the first PCB, the third PCB comprising a third electrical contact containing solder or conductive adhesive that faces away from the second PCB, the first PCB comprising a fourth electrical contact in the slot that aligns to the third electrical contact at least in part when the third PCB is in the slot;

simultaneously forcing the third electrical contact containing solder or conductive adhesive against the fourth electrical contact and away from the second PCB; and treating the solder or conductive adhesive to implement electrical connections between the first PCB and the second PCB and between the first PCB and the third PCB;

wherein the second PCB comprises first capacitors that are electrically connected to the second electrical contact and the third PCB comprises second capacitors that are electrically connected to the third electrical contact.

14. The method of claim 13, wherein the second PCB comprises a second ground electrical contact containing solder or conductive adhesive, the first PCB comprising a first ground electrical contact in the slot that aligns to the second ground electrical contact at least in part when the second PCB is in the slot in the first PCB;

wherein forcing the second electrical contact also comprises simultaneously forcing the second ground electrical contact containing solder or conductive adhesive against the first ground electrical contact;

wherein the third PCB comprises a third ground electrical contact containing solder or conductive adhesive that faces away from the second PCB, the first PCB comprising a fourth ground electrical contact in the slot that aligns to the third ground electrical contact at least in part when the third PCB is in the slot; and wherein forcing the third electrical contact also comprises simultaneously forcing the third ground electrical contact containing solder or conductive adhesive against the fourth ground electrical contact and away from the second PCB.

15. The method of claim 13, wherein the first PCB comprises multiple power layers, multiple ground layers, multiple electrical contacts each electrically connected to a power layer, and multiple ground electrical contacts each electrically connected to a ground layer;

wherein the second PCB comprises multiple electrical contacts each making an electrical connection to one of the electrical contacts on the first PCB when the second PCB is in the slot;

wherein the second PCB comprises multiple ground electrical contacts each making an electrical connection to one of the ground electrical contacts on the first PCB when the second PCB is in the slot;

wherein the third PCB comprises multiple electrical contacts each making an electrical connection to one of the electrical contacts on the first PCB when the third PCB is in the slot; and wherein the third PCB comprises multiple ground electrical contacts each making an electrical connection to one of the ground electrical contacts on the first PCB when the third PCB is in the slot.

16. The method of claim 13, further comprising:

inserting a wire between the second PCB and the third PCB, the wire forcing the third electrical contact containing solder or conductive adhesive against the fourth electrical contact and simultaneously away from the second PCB.

17. The method of claim 13, wherein, when inserted into the first PCB, the second PCB and the third PCB are orthogonal to the first PCB.

18. The method of claim 13, wherein, prior to treating, the second PCB comprises solder or conductive adhesive directly above the second electrical contact;

wherein, prior to treating, the third PCB comprises solder or conductive adhesive directly above the third electrical contact;

wherein treating causes the solder or conductive adhesive directly above the second electrical contact to migrate onto the second electrical contact; and wherein treating causes the solder or conductive adhesive directly above the t electrical contact to migrate onto the third electrical contact.

19. The method of claim 13, further comprising stabilizing the second PCB and the third PCB relative to the first PCB;

wherein stabilizing comprises adding stabilizing material to one or more of the following locations: ends of the second PCB and the third PCB that are farthest from the first PCB, where the second PCB and the third PCB intersect the first PCB, or where ends of the second PCB and the third PCB terminate within the first PCB.

20. The method of claim 13, wherein the first PCB comprises a device interface board (DIB) of a test system, the DIB for providing mechanical and electrical connections between multiple devices under test (DUTs) and test electronics included in the test system.

21. The method of claim 13, further comprising:
changing a capacitance associated with the power layer by adding or removing one or more pairs of PCBs, where each pair is comprised of two PCBs of a type of the second PCB and the third PCB.

22. The method of claim 13, further comprising:
adding a clamp that forces together at least ends of the second PCB and the third PCB that are farthest from the first PCB.

23. The method of claim 13, wherein treating comprises heating the solder to form the electrical connections between the first PCB and the second PCB and between the first PCB and the third PCB.

24. The method of claim 13, wherein treating comprises curing the conductive adhesive to form the electrical connections between the first PCB and the second PCB and between the first PCB and the third PCB.

25. The method of claim 13, wherein the first capacitors and the second capacitors are configured to increase capacitance between one or more power layers and one or more ground layers without providing a proportional increase in inductance.

* * * * *